(12) United States Patent
Ishiwata et al.

(10) Patent No.: US 8,514,616 B2
(45) Date of Patent: Aug. 20, 2013

(54) MAGNETIC MEMORY ELEMENT AND MAGNETIC MEMORY

(75) Inventors: Nobuyuki Ishiwata, Tokyo (JP);
Norikazu Ohshima, Tokyo (JP);
Shunsuke Fukami, Tokyo (JP);
Kiyokazu Nagahara, Tokyo (JP);
Tetsuhiro Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 183 days.

(21) Appl. No.: 13/201,815

(22) PCT Filed: Feb. 15, 2010

(86) PCT No.: PCT/JP2010/052189
§ 371 (c)(1),
(2), (4) Date: Aug. 16, 2011

(87) PCT Pub. No.: WO2010/095589
PCT Pub. Date: Aug. 26, 2010

(65) Prior Publication Data
US 2011/0298067 A1    Dec. 8, 2011

(30) Foreign Application Priority Data
Feb. 17, 2009  (JP) .................................. 2009-033368

(51) Int. Cl.
*G11C 11/14* (2006.01)

(52) U.S. Cl.
USPC .................... 365/158; 365/171; 257/E29.323

(58) Field of Classification Search
USPC ................................................. 257/E21.665
See application file for complete search history.

(56) References Cited

U.S. PATENT DOCUMENTS 7,869,266 B2 *  1/2011  Ranjan et al. ................. 365/158
8,174,086 B2 *  5/2012  Fukami et al. ................. 257/421

(Continued)

FOREIGN PATENT DOCUMENTS

JP    2005-123617 A    5/2005
JP    2005-191032 A    7/2005

(Continued)

OTHER PUBLICATIONS

N. Sakimura, et al., "MRAM Cell Technology for Over 500MHz SoC", 2006 Symposium on VLSI Circuits Digest of Technical Papers, 2006, pp. 136-137.

(Continued)

*Primary Examiner* — Benjamin Sandvik
(74) *Attorney, Agent, or Firm* — Sughrue Mion, PLLC (57) ABSTRACT

A magnetoresistive effect element includes: a magnetization free layer; a non-magnetic insertion layer provided adjacent to the magnetization free layer; a magnetic insertion layer provided adjacent to the non-magnetic insertion layer and opposite to the magnetization free layer with respect to the non-magnetic insertion layer; a spacer layer provided adjacent to the magnetic insertion layer and opposite to the non-magnetic insertion layer with respect to the magnetic insertion layer; and a first magnetization fixed layer provided adjacent to the spacer layer and opposite to the magnetic insertion layer with respect to the spacer layer. The magnetization free layer and the first magnetization fixed layer have magnetization components in directions approximately perpendicular to a film surface. The magnetization free layer includes two magnetization fixed portions and a domain wall motion portion arranged between the two magnetization fixed portions. Magnetization of one of the two magnetization fixed portions and magnetization of the other of the two magnetization fixed portions are fixed approximately anti-parallel to each other in a direction approximately perpendicular to a film surface. The domain wall motion portion has a magnetic anisotropy in a direction perpendicular to a film surface.

18 Claims, 8 Drawing Sheets

(56) References Cited

U.S. PATENT DOCUMENTS

| | | | |
|---|---|---|---|
| 8,406,046 B2* | 3/2013 | Kobayashi | 365/173 |
| 2010/0046288 A1 | 2/2010 | Honjou et al. | |
| 2013/0021843 A1* | 1/2013 | Mitou | 365/158 |

FOREIGN PATENT DOCUMENTS

| | | |
|---|---|---|
| JP | 2005-203443 A | 7/2005 |
| JP | 2006-073930 A | 3/2006 |
| JP | 2006-270069 A | 10/2006 |
| JP | 2006-287081 A | 10/2006 |
| WO | 2008/068967 A1 | 6/2008 |
| WO | 2008/009926 A1 | 8/2008 |
| WO | 2009/001706 A1 | 12/2008 |

OTHER PUBLICATIONS

A. Yamaguchi, et al., "Real-Space Observation of Current-Driven Domain Wall Motion in Submicron Magnetic Wires", Physical Review Letters, Feb. 20, 2004, pp. 077205-1-077205-4, vol. 92, No. 7.

Akinobu Yamaguchi, et al., "Reduction of Threshold Current Density for Current-Driven Domain Wall Motion using Shape Control", Japanese Journal of Applied Physics, 2006, pp. 3850-3853, vol. 45, No. 5A.

A. Thiaville, et al., "Micromagnetic understanding of current-driven domain wall motion in patterned nanowires", Europhysics Letters, Mar. 15, 2005, pp. 990-996, vol. 69, No. 6.

S. Imada, et al., "Perpendicular magnetization of $L1_0$-ordered FePt films in the thinnest limit", Applied Physics Letters, 2007, pp. 1-3, vol. 90, No. 132507.

C. L. Platt, et al., "Structural and magnetic properties of CoCrPt perpendicular media grown on different buffer layers", Journal of Magnetism and Magnetic Materials, 2002, pp. 153-158, vol. 247.

* cited by examiner

MAGNETIC MEMORY ELEMENT AND MAGNETIC MEMORY

CROSS REFERENCE TO RELATED APPLICATIONS

This application is a National Stage of International Application No. PCT/JP2010/052189 filed Feb. 15, 2010, claiming priority based on Japanese Patent Application No. 2009-033368 filed Feb. 17, 2009, the contents of all of which are incorporated herein by reference in their entirety.

TECHNICAL FIELD

The present invention relates to a magnetic memory element and magnetic memory. More particularly, the present invention relates to a magnetic memory element and magnetic memory using a domain wall motion.

BACKGROUND ART

A magnetic random access memory (MRAM) is expected and actively developed as a nonvolatile memory capable of performing a high-speed operation and rewriting an infinite number of times. In the MRAM, a magnetic material is used as a memory element, and data is stored in the memory element as a magnetization direction of the magnetic material. Some methods for switching the magnetization direction of the magnetic material are proposed. Those methods have in common with usage of a current. To put a MRAM into practical use, it is important to reduce a writing current as much as possible. According to the non-patent literature 1, it is required that a wiring current should be reduced to be equal to or less than 0.5 mA, preferably equal to or less than 0.2 mA.

The most general method of writing data in a MRAM is a method switching a magnetization direction of a magnetic memory element by a magnetic field which is generated by passing a current through a wiring line for a writing operation prepared on the periphery of the magnetic memory element. Since this method uses the magnetization switching caused by the magnetic field, the MRAM can theoretically perform writing at the speed of 1 nano-second or less and thus, this MRAM is suitable for a high-speed MRAM. However, a magnetic field for switching magnetization of a magnetic material securing thermal stability and resistance against external disturbance magnetic field is generally a few dozens of [Oe]. In order to generate such magnetic field, a writing current of about a few mA is needed. In this case, a chip area is necessarily large and power consumed for writing increases. Therefore, this MRAM is not competitive with other kinds of random access memories. In addition, when a size of a memory cell is miniaturized, a writing current further increases and is not scaling, which is not preferable.

Recently, as methods to solving these problems, following two methods are proposed. The first method is a method using a spin transfer magnetization switching. This method uses a laminated layer including a first magnetic layer which has magnetization that can be switched, and a second magnetic layer which is electrically connected to the first magnetic layer and has magnetization that is fixed. In the method, the magnetization in the first magnetic layer is switched by using an interaction between spin-polarized conduction electrons and localized electrons in the first magnetic layer when a current flows between the second magnetic layer and the first magnetic layer. The spin transfer magnetization switching is generated when a current density is equal to or more than a certain value. Accordingly, as the size of the element decreases, the writing current is also reduced. In other words, the spin transfer magnetization switching method is excellent in scaling performance. However, generally, an insulating film is provided between the first magnetic layer and the second magnetic layer and a relatively large current should be made to flow through the insulating film in the writing operation. Thus, there are problems regarding resistance to writing and reliability. In addition, there is concern that a writing error occurs in a reading operation because a current path of the writing operation is the same as that of the reading operation. As mentioned above, although the spin transfer magnetization switching method is excellent in scaling performance, there are some obstacles to put it into practical use.

The other method is a method using a current driven domain wall motion effect. The magnetization switching method using a current driven domain wall motion effect can solve the above-mentioned problems that the spin transfer magnetization switching method is confronted with. For example, MRAMs using the current driven domain wall motion effect are disclosed in the patent literatures 1 to 5. Specifically, the patent literature 3 discloses a magnetoresistive effect element formed of a magnetic material film having a magnetization in a thickness direction. In a MRAM using the current driven domain wall motion effect, generally, magnetization of both end portions of the first magnetic layer having magnetization which can be switched are fixed such that the magnetization of one end portion is approximately anti-parallel to that of the other end portion. In the case of such magnetization arrangement, a domain wall is introduced into the first magnetic layer. Here, as reported in the non-patent literature 2, when a current flows through the domain wall, the domain wall moves in the direction same as the direction of the conduction electrons. Therefore, data writing can be realized by making the current flow inside the first magnetic layer. The current driven domain wall motion is generated when the current density is equal to or more than a certain value. Thus, this MRAM has the scaling property similar to the MRAM using the spin transfer magnetization switching. In addition, in the MRAM element using the current driven domain wall motion, the writing current does not flow through the insulating layer in the magnetic tunnel junction and the current path of the writing operation is different from that of the reading operation. Consequently, the above-mentioned problems caused in the spin transfer magnetization switching can be solved.

However, the inventors have now discovered the following facts.

In a MRAM using the current driven domain wall motion effect, there is concern that the absolute value of the writing current becomes relatively large. Other literatures other than the non-patent literature 2 report observations of the current induced domain wall motion, and the current density of approximately $1 \times 10^8$ A/cm$^2$ is required for the domain wall motion. For example, it is assumed that a width and a thickness of a layer where the domain wall motion arises are 100 nm and 10 nm, respectively. In this case, the writing current is 1 mA. In order to reduce the writing current less than this value, it may be considered that the film thickness should be thinner than before. However, in this case, it is known that the threshold current density required for writing further increase (for example, see the non-patent literature 3).

Furthermore, in order to generate the current driven domain wall motion, a width of a layer where the domain wall motion arises is required to be equal to or less than 10 nm. This leads to great difficulty in fabricating the layer. In addition, there is concern that using the wiring current with the current density of approximately $1 \times 10^8$ A/cm$^2$ for the domain wall motion causes the electromigration and the negative impact due to temperature increase.

In order to solve the above-mentioned problems, the inventors have now considered the following magnetoresistive effect element. The magnetoresistive effect element includes: a magnetization free layer; a spacer layer provided adjacent to the magnetization free layer; a first magnetization fixed layer provided adjacent to the spacer layer and opposite to the magnetization free layer with respect to the spacer layer; and at least two second magnetization fixed layers provided adjacent to the magnetization free layer. The magnetization free layer, the first magnetization fixed layer and the second magnetization fixed layers have magnetization components in a direction perpendicular to the film surface. The magnetization free layer includes: two magnetization fixed portions and a domain wall motion portion arranged between the two magnetization fixed portions. The magnetization of one of the two magnetization fixed portions and the magnetization of the other of the two magnetization fixed portions are fixed approximately anti-parallel to each other in the direction perpendicular to the film surface by the two second magnetization fixed layers. The domain wall motion portion has a magnetic anisotropy in the direction perpendicular to the film surface. The domain wall motion portion of the magnetization free layer, the spacer layer and the first magnetization fixed layer constitutes a magnetic tunneling junction (MTJ).

In this magnetoresistive effect element considered by the inventors, when the data writing operation is performed, the writing current flows through one of the two second magnetization fixed layers, the magnetization free layer, and the other of the two second magnetization fixed layers. In addition, when the data reading operation is performed, the reading current flows through one of the two second magnetization fixed layers, the magnetization free layer, the spacer layer and the first magnetization fixed layer.

In this way, this magnetoresistive element uses a magnetic material film with perpendicular magnetic anisotropy and the domain wall motion effect. Therefore, a magnetoresistive effect element and a MRAM using the same as a memory cell are provided, in which the writing current is sufficiently reduced, the current density thereof is reduced, and the magnetization switching is performed by using the current driven domain wall motion effect.

However, in this magnetoresistive effect element, the magnetization free layer constituting the domain wall motion portion for writing and the magnetization free layer (domain wall motion portion) constituting the magnetic tunneling junction (MTJ) for reading are shared. Therefore, optimization of the magnetic properties of the domain wall motion portion as the writing member and optimization of the magnetic properties of magnetization free layer (the domain wall motion portion) of the MTJ as the reading member cannot be respectively executed independently. As a result, the reduction of the writing current and the increase of the reading magnetoresistive effect (MR) are not compatible.

CITATION LIST

Patent Literature
 Patent Literature 1: JP2005-123617A
 Patent Literature 2: JP2005-191032A
 Patent Literature 3: JP2006-73930A
 Patent Literature 4: JP2006-270069A
 Patent Literature 5: JP2006-287081A
Non Patent Literature
 Non Patent Literature 1: 2006 Symposium on VLSI Circuits, Digest of Technical Papers, p. 136 (2006).

Non Patent Literature 2: Physical Review Letters, Vol. 92, p. 077205 (2004).
 Non Patent Literature 3: Japanese Journal of Applied Physics, vol. 45, No. 5A, pp. 3850-3853 (2006).
 Non Patent Literature 4: Europhysics Letters, vol. 69, pp. 990-996 (2005).
 Non Patent Literature 5: Applied Physics Letters, vol. 90, 132507 (2007).
 Non Patent Literature 6: Journal of Magnetism and Magnetic Materials, vol. 247, pp. 153-158 (2002).

SUMMARY OF INVENTION

An object of the present invention is to provide a magnetoresistive effect element and a MRAM in which a writing current is sufficiently reduced and a reading magnetoresistive effect (MR) is sufficiently increased.

The magnetoresistive effect element according to the present invention includes: a magnetization free layer, a non-magnetic insertion layer, a magnetic insertion layer, a spacer layer and a first magnetization fixed layer. The non-magnetic insertion layer is provided adjacent to the magnetization free layer. The magnetic insertion layer is provided adjacent to the non-magnetic insertion layer and opposite to the magnetization free layer with respect to the non-magnetic insertion layer. The spacer layer is provided adjacent to the magnetic insertion layer and opposite to the non-magnetic insertion layer with respect to the magnetic insertion layer. The first magnetization fixed layer is provided adjacent to the spacer layer and opposite to the magnetic insertion layer with respect to the spacer layer. The magnetization free layer and the first magnetization fixed layer have magnetization components in directions approximately perpendicular to a film surface. The magnetization free layer includes two magnetization fixed portions and a domain wall motion portion arranged between the two magnetization fixed portions. Magnetization of one of the two magnetization fixed portions and magnetization of the other of the two magnetization fixed portions are fixed approximately anti-parallel to each other in a direction approximately perpendicular to a film surface. The domain wall motion portion has a magnetic anisotropy in a direction perpendicular to a film surface.

The magnetic random access memory according to the present invention includes: a plurality of memory cells arranged in a array shape, each having the above-mentioned magnetoresistive effect element.

According to the present invention, a magnetoresistive effect element and a MRAM can be provided, in which a writing current is sufficiently reduced and a reading magnetoresistive effect is sufficiently increased.

DESCRIPTION OF EXEMPLARY EMBODIMENTS

Exemplary embodiments of a magnetoresistive effect element and a MRAM according to the present invention will be described below referring to the accompanying drawings.
(Configuration of Magnetoresistive Effect Element)

Figure 1A:
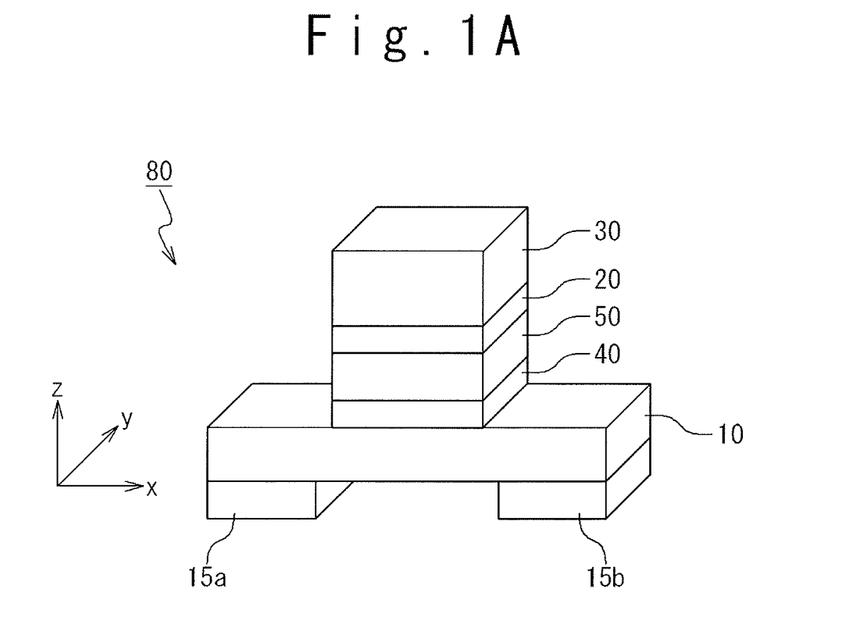
FIG. 1A is a perspective view showing a configuration of a main part of a magnetoresistive effect element according to an exemplary embodiment of the present invention.
Figure 1B:
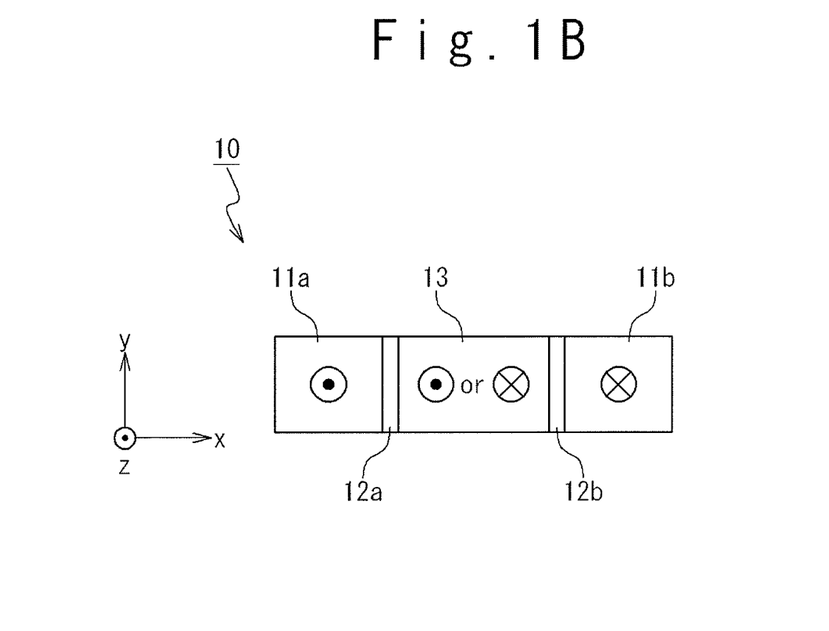
FIG. 1B is a plane view showing the configuration of the main part of the magnetoresistive effect element according to the exemplary embodiment of the present invention.
Figure 1C:
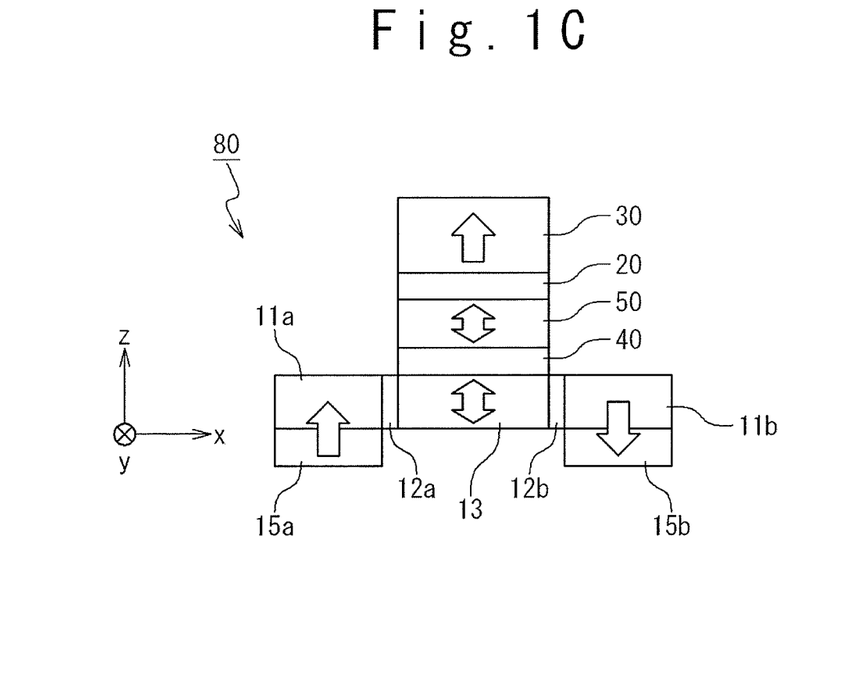
FIG. 1C is a sectional view showing the configuration of the main part of the magnetoresistive effect element according to the exemplary embodiment of the present invention.

FIG. 1A is a perspective view showing a configuration of a main part of a magnetoresistive effect element according to an exemplary embodiment of the present invention. Hereinafter, the exemplary embodiments are described below defining an x-y-z Cartesian coordinate system as shown in FIG. 1A. FIG. 1B is an x-y plane view showing the configuration of the main part of the magnetoresistive effect element. Here, symbols of an open circle with a dot and an open circle with an x-mark show magnetization directions upward and downward, respectively, perpendicular to the drawing paper (hereinafter, they are the same). When both symbols are written, it is shown that it can be possible to take both magnetization directions. FIG. 1C is an x-z sectional view showing the configuration of the main part of the magnetoresistive effect element. Here, arrows show magnetization directions, respectively (hereinafter, they are the same). A two-headed arrow shows that it can be possible to take two magnetization directions.

As shown in FIG. 1A, the magnetoresistive effect element 80 includes: a magnetization free layer 10, a non-magnetic insertion layer 40, a magnetic insertion layer 50, a spacer layer 20, a first magnetization fixed layer 30 and second magnetization fixed layers 15a and 15b. The magnetization free layer 10 is provided extending in the x direction. The non-magnetic insertion layer 40 is provided adjacent to the magnetization free layer 10. The magnetic insertion layer 50 is provided adjacent to the non-magnetic insertion layer 40 and opposite to the magnetization free layer 10 with respect to the non-magnetic insertion layer 40. The spacer layer 20 is provided adjacent to the magnetic insertion layer 50 and opposite to the non-magnetic insertion layer 40 with respect to the magnetic insertion layer 50. The first magnetization fixed layer 30 is provided adjacent to the spacer layer 20 and opposite to the magnetic insertion layer 50 with respect to the spacer layer 20. The second magnetization fixed layers 15a and 15b are provided adjacent to both end portions of the magnetization free layer 10, respectively.

The spacer layer 20 is preferably formed of a non-magnetic insulator. In this case, the magnetic insertion layer 50, the spacer layer 20, the magnetization fixed layer 30 function as a magnetic tunneling junction (MTJ) producing the TMR (tunneling magnetoresistance) effect. The spacer layer 20 may be formed of a conductive material or a semiconductor material. In this case, the magnetic insertion layer 50, the spacer layer 20, the magnetization fixed layer 30 function as a spin-valve producing the GMR (giant magnetoresistance) effect.

The magnetization free layer 10, the magnetic insertion layer 50, the first magnetization fixed layer 30 and the second magnetization fixed layers 15a and 15b are formed of ferromagnetic materials. In FIG. 10, magnetization directions of the magnetization free layer 10, the magnetic insertion layer 50, the first magnetization fixed layer 30 and the second magnetization fixed layers 15a and 15b are shown as arrows. As shown in FIG. 1C, the magnetization directions of the magnetization free layer 10, the magnetic insertion layer 50, the first magnetization fixed layer 30 and the second magnetization fixed layers 15a and 15b are approximately parallel to the z axis. In order to realize these magnetization directions, the magnetization free layer 10, the magnetic insertion layer 50, the first magnetization fixed layer 30 and the second magnetization fixed layers 15a and 15b are preferably formed of materials and/or lamination films having perpendicular magnetization. In this case, the lamination film may be formed of ferromagnetic material films laminated to each other, or may be formed of ferromagnetic material film(s) and non-magnetic material film(s) laminated to each other.

As shown in FIG. 1B, the magnetization free layer 10 includes a magnetization fixed portions 11a and 11b, a domain wall motion portion 13 and domain wall pinning sites 12a and 12b. As shown in FIG. 1C, the magnetic insertion layer 50 is provided so as to overlap with at least a part of the domain wall motion portion 13. The second magnetization fixed layers 15a and 15b are provided adjacent to the magnetization fixed portions 11a and 11b, respectively. Thus, the magnetization directions of the magnetization fixed portions 11a and 11b are fixed in directions approximately anti-parallel to each other. The domain wall motion portion 13 is formed such that the magnetization direction can be switched within directions between the +z direction and the −z direction. In this case, based on the magnetization directions of the magnetization fixed portions 11a and 11b and the domain wall motion portion 13, a domain wall is formed at any one of the domain wall pinning site 12a and the domain wall pinning site 12b. The domain wall pinning sites 12a and 12b function to pin the domain wall stably when a magnetic field or a current is applied to this system. Here, it is found that the domain wall can be naturally pinned without providing special structures as the domain wall pinning sites 12a and 12b in the structure shown in FIGS. 1A to 1C, according to the micromagnetics calculation. However, ingenuity for intentionally strengthening pinning potential more may be applied to the domain wall pinning sites 12a and 12b. For example, dents may be formed at the positions. Alternatively, the size of the domain wall motion portion 13 may be made to be smaller than that of each of the magnetization fixed portions 11a and 11b such that the y-z sectional areas of the domain wall motion portion 13 at the positions are made to be discontinuous to those of the magnetization fixed portions 11a and 11b, respectively.

The magnetization fixed portions 11a and 11b and the first magnetization fixed layer 30 are connected to external wiring lines different from each other. Here, the magnetization fixed portions 11a and 11b may be electrically connected to external wiring lines through the second magnetization fixed layers 15a and 15b. In this way, the magnetoresistive effect element 80 is a three-terminal element. In addition, as not shown in FIGS. 1A to 10, an electrode layer for a contact to a wiring line is preferably provided adjacent to each of the first magnetization fixed layer 30 and the magnetization free layer 10 or the second magnetization fixed layers 15.

(Writing Method)

Figure 2A:
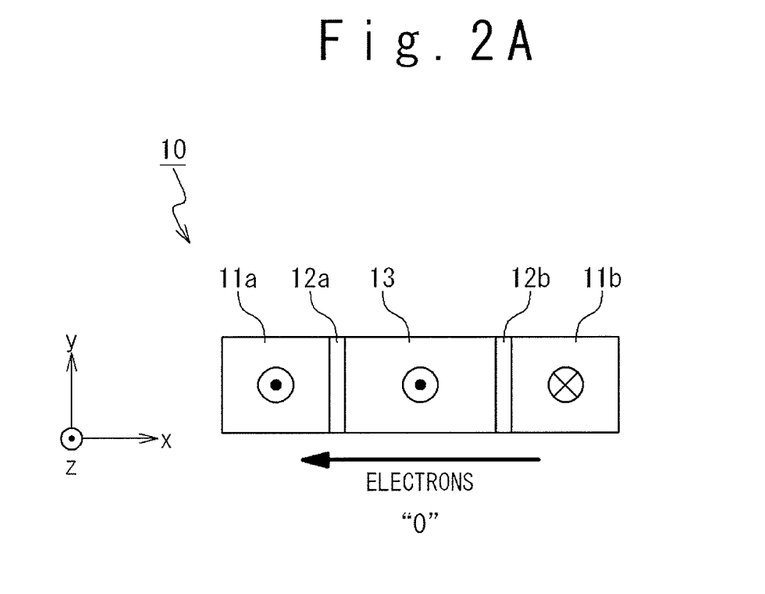
FIG. 2A is a plane view for describing a method of writing data into the magnetoresistive effect element according to the exemplary embodiment of the present invention.
Figure 2B:
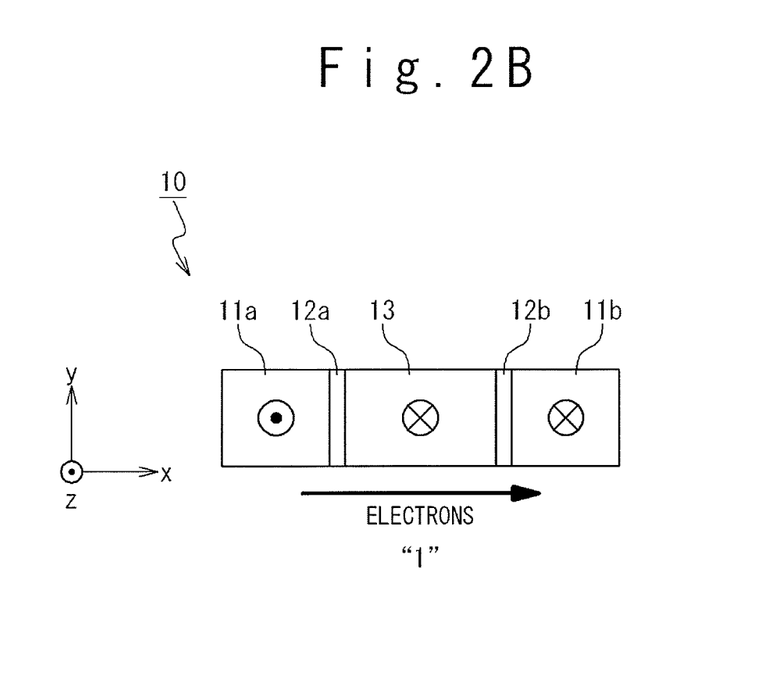
FIG. 2B is a plane view for describing a method of writing data into the magnetoresistive effect element according to the exemplary embodiment of the present invention.

The method of writing data into the magnetoresistive effect element 80 will be described. FIGS. 2A and 2B are plane views for describing the method of writing data into the magnetoresistive effect element according to the exemplary embodiment of the present invention. FIGS. 2A and 2B schematically show the states that the magnetoresistive effect element 80 can take, namely, the "0" state and the "1" state. Here, the "0" state is a state that the data "0" is written in the magnetoresistive effect element 80 and the "1" state is a state that the data "1" is written in the magnetoresistive effect element 80. The "0" state is defined that the magnetization of the domain wall motion portion 13 is in the +z direction (FIG. 2A). The "1" state is defined that the magnetization of the domain wall motion portion 13 is in the -z direction (FIG. 2B). Hereinafter, as shown in FIGS. 2A and 2B, it is assumed that the magnetization of the first magnetization fixed portion 11a is fixed in the +z direction, and the magnetization fixed portion 11b is fixed in the -z direction. Incidentally, it is only necessary that the magnetization directions of the magnetization fixed portions 11a and 11b are approximately antiparallel to each other, and therefore the magnetization directions are not limited to the above-mentioned case. In addition, it goes without saying that the definition of the relation between the data values and the magnetization directions of the domain wall motion portion 13 is not limited to the above-mentioned case.

In the magnetization states as described above, in the "0" state, the domain wall is formed at the domain wall pinning site 12b, and in the "1" state, the domain wall is formed at the domain wall pinning site 12a. In the present exemplary embodiment, by switching a direction of the writing current flowing in the magnetization free layer 10, the domain wall is made to move between the domain wall pinning sites 12a and 12b, thereby enabling to write desired data into the magnetoresistive effect element 80. For example, in the case that the magnetoresistive effect element 80 is in the "0" state as shown in FIG. 2A, when the writing current is made to flow in the +x direction (that is, the conduction electrons are made to flow in the -x direction as shown in the arrow of FIG. 2A), the domain wall at the domain wall pinning site 12b receives spin transfer torque caused by the conduction electrons (spin-polarized electrons) and moves toward the same direction as the conduction electrons to reach the domain wall pinning site 12a. In the case that the magnetoresistive effect element 80 is in the "1" state as shown in FIG. 2B, when the writing current is made to flow in the -x direction (that is, the conduction electrons are made to flow in the +x direction as shown in the arrow of FIG. 2B), the domain wall at the domain wall pinning site 12a receives spin transfer torque caused by the conduction electrons (spin-polarized electrons) and moves toward the same direction as the conduction electrons to reach the domain wall pinning site 12b. In this way, the data writing from the "0" state to the "1" state and form the "1" state to the "0" state can be realized.

In addition, in the case that the magnetoresistive effect element 80 is in the "0" state as shown in FIG. 2A, when the writing current is made to flow in the -x direction, that is, the data "0" is tried to be written, the domain wall is tried to move toward the +x direction. However, since the magnetization of the magnetization fixed portion 11b is strongly fixed sufficiently, the domain wall motion does not arise. Therefore, it is also possible to perform the writing operation in which the magnetization direction is not switched. Alternatively, even if the magnetization direct ion of the magnetization fixed portion 11b is switched into the +z direction by the domain wall motion, if a means for returning to the former state in which the magnetization direction is the -z direction when the writing current is stopped is provided, the above-mentioned writing operation in which the magnetization direction is not switched can be realized. As the means for returning to the former state, the magnetic interaction between the magnetization fixed portion 11b and the second magnetization fixed layer 15 can be used. Furthermore, in the case that the magnetoresistive effect element 80 is in the "1" state as shown in FIG. 2B, when the writing current is made to flow in the +x direction, that is, the data "1" is tried to be written, the situation is similar to the above-mentioned case.

(Reading Method)

Figure 3A:
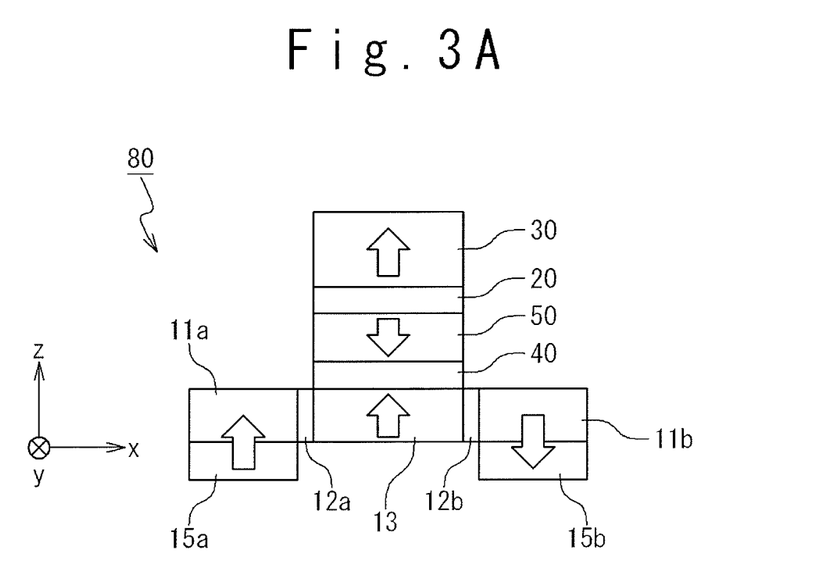
FIG. 3A is a sectional view for describing a method of reading data from the magnetoresistive effect element according to the exemplary embodiment of the present invention.
Figure 3B:
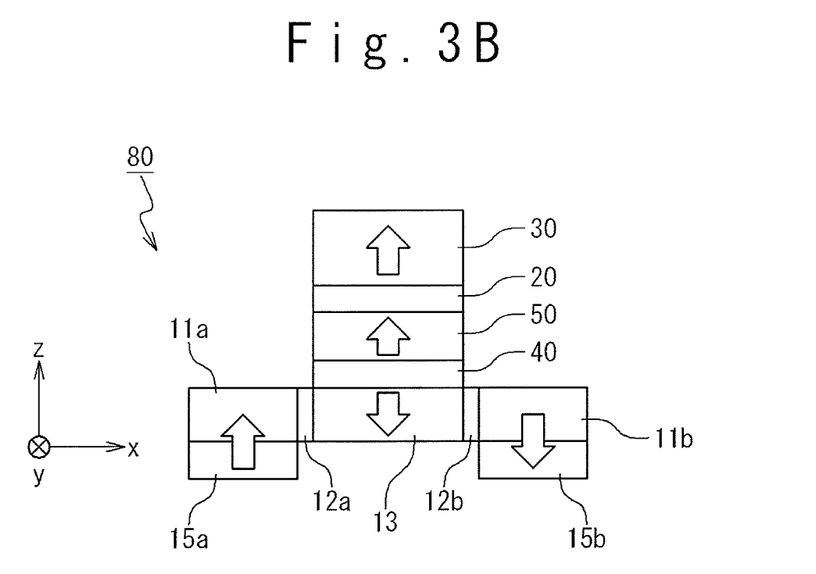
FIG. 3B is a sectional view for describing a method of reading data from the magnetoresistive effect element according to the exemplary embodiment of the present invention.

The method of reading data from the magnetoresistive effect element 80 will be described. FIGS. 3A and 3B are sectional view for describing a method of reading data from the magnetoresistive effect element according to the exemplary embodiment of the present invention. As described above, in the present exemplary embodiment, data is stored based on the magnetization direction of the domain wall motion portion 13. The domain wall motion portion 13 is connected to the magnetic insertion layer 50 through the non-magnetic insertion layer 40. The magnetic insertion layer 50 is connected to the first magnetization fixed layer 30 through the spacer layer 20. Here, whether the magnetization direction of the domain wall motion portion 13 and the magnetization direction of the magnetic insertion layer 50 are parallel or anti-parallel is determined based on the selection of the non-magnetic insertion layer 40. FIGS. 3A and 3B show the case that directions are anti-parallel. In order that the directions are parallel, for example, there is a method using a Ta film with the film thickness equal to or less than 1 nm as the non-magnetic insertion layer 40. In order that the directions are anti-parallel, for example, there is a method using a Ru film with the film thickness of approximately 0.8 nm or 2 nm as the non-magnetic insertion layer 40.

For reading data from the magnetoresistive effect element 80, the magnetoresistive effect (MR) is used. By using the magnetoresistive effect, the resistance value of the magnetic tunneling junction (or the spin valve) including the magnetic insertion layer 50, the spacer layer 20 and the first magnetization fixed layer 30 is varied based on the magnetization direction of the magnetic insertion layer 50. Therefore, by making the reading current flow between the magnetization free layer 10 and the first magnetization fixed layer 30, data can be read from the magnetoresistive effect element 80. For example, as shown in FIG. 3A, when the magnetization direction of the magnetic insertion layer 50 and the magnetization direction of the first magnetization fixed layer 30 are anti-parallel, the high resistance state can be realized. On the other hand, as shown in FIG. 3B, the magnetization direction of the magnetic insertion layer 50 and the magnetization direction of the first magnetization fixed layer 30 are parallel, the low resistance state can be realized. By measuring these high resistance state and the low resistance state, data can be read from the magnetoresistive effect element 80.

(Advantages of Magnetoresistive Element)

In the magnetoresistive element 80 of the present exemplary embodiment, the material selection for the magnetization free layer 10 in which the writing operation is carried out using the domain wall motion caused by the current can be performed independently from the material selection for the magnetic insertion layer 50 corresponding to a magnetization switching layer in which the reading operation is carried out using the magnetoresistive effect. Therefore, the reduction of the writing current of the domain wall motion and the increase of the reading output by the increase of the MR ratio can be achieved.

Examples of specific materials are shown below. First, the materials of the magnetization free layer 10, the first magnetization fixed layer 30, the second magnetization fixed layers 15 are magnetic materials with perpendicular magnetization and preferably includes at least one material selected from Fe, Co and Ni. In addition, the perpendicular magnetic anisotropy can be stable by further containing Pt and/or Pd. Besides, by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au, Sm and the like, the magnetic properties can be adjusted such that desired magnetic properties are realized. For example, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co and the like are listed. Furthermore, perpendicular magnetic anisotropy can be realized by laminating a layer containing any one material selected from Fe, Co and Ni and another layer. Specifically, a lamination film such as Co/Pd, Co/Pt, Co/Ni, Co/Fe, Fe/Au, Fe/Pt, Fe/Pd, Fe/Ni or the like is exemplified.

The magnetic insertion layer 50 is magnetically coupled in parallel or anti-parallel with the magnetization free layer 10 through the non-magnetic insertion layer 40. Therefore, it may be unnecessary for the magnetic insertion layer 50 to have perpendicular magnetization. When a magnetic material with perpendicular magnetization is used for the magnetic insertion layer 50, the material similar to that of the magnetization free layer 10, the first magnetization fixed layer 30 or the second magnetization fixed layers 15 can be used. When an in-plane magnetization film is used for the magnetic insertion layer 50, a material containing at least one material selected from Fe, Co and Ni is preferable. Besides, by adding B, C, N, O, Al, Si, P, Ti, V, Cr, Mn, Cu, Zn, Zr, Nb, Mo, Tc, Ru, Rh, Ag, Hf, Ta, W, Re, Os, Tr, Au, Sm and the like, the magnetic properties can be adjusted such that desired magnetic properties are realized. For example, Fe, Co, Ni, CoFe, NiFe, CoFeNi, CoFeB are preferable.

Figure 4:
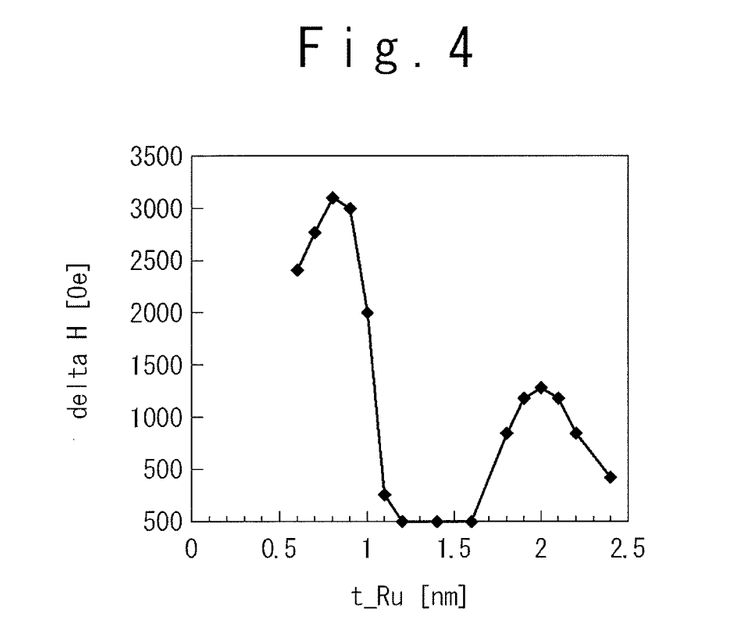
FIG. 4 is a graph showing a dependence property of an anti-parallel magnetic coupling strength with respect to a Ru film thickness when Ru is used for the non-magnetic insertion layer.

The material of the non-magnetic insertion layer 40 is a material capable of magnetically coupling the magnetization free layer 10 and the magnetic insertion layer 50, and preferably includes at least one material selected from Ti, V, Cr, Mn, Cu, Zn, Zr, Nb, Mo, Tc, Ru, Rh, Ag, Hf, Ta, W, Re, Os, Ir, Au and Sm. For example, FIG. 4 is a graph showing a dependence property of strength of anti-parallel magnetic coupling of the magnetization free layer 10 and the magnetic insertion layer 50 with respect to a Ru film thickness when Ru is used for the non-magnetic insertion layer 40. The vertical axis indicates the strength of anti-parallel magnetic coupling [Oe], and the horizontal axis indicates the Ru film thickness. By setting appropriate Ru film thickness, the magnetization of the magnetization free layer 10 and the magnetization of the magnetic insertion layer 50 can be magnetically coupled in anti-parallel. In this case, as the Ru film thickness, approximately 0.8 nm or 2 nm is appropriate.

The spacer layer 20 is preferably formed of insulator. As the material of the spacer layer 20, Mg—O, Al—O, Al—N, Ni—O, Hf—O and the like are exemplified. Here, the present exemplary embodiment can be realized even using a semiconductor or a metal. Specifically, Cr, Al, Cu, and Zn are exemplified.

(Circuit Configuration and Layout of Magnetic Memory Cell)

Figure 5:
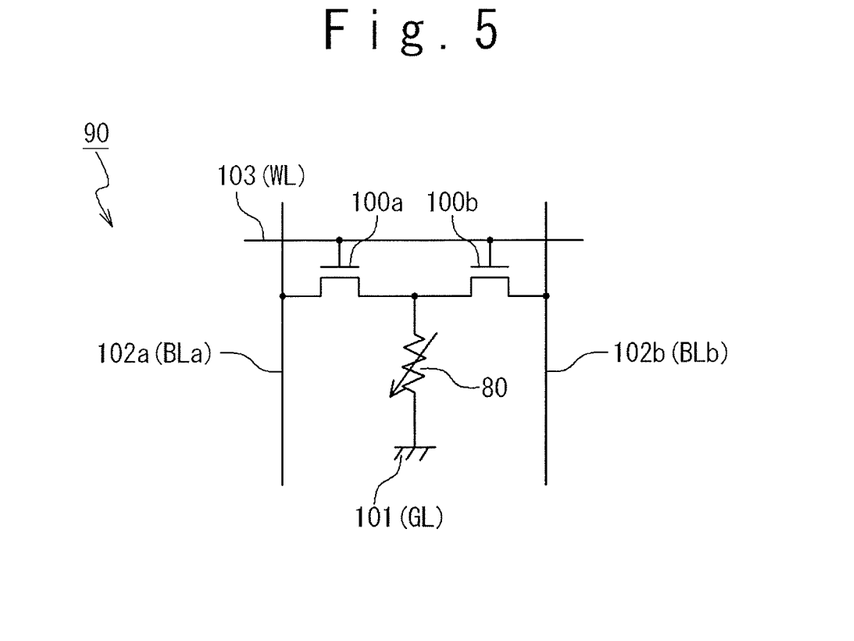
FIG. 5 is a circuit diagram showing an example of a configuration of a single cell of a magnetic memory cell according to the exemplary embodiment of the present invention.

Next, a circuit configuration and a layout of the magnetic memory cell 90 using the magnetoresistive effect element 80 according to the exemplary embodiment of the present invention will be described. FIG. 5 is a circuit diagram showing an example of a configuration of a single magnetic memory cell 90 according to the exemplary embodiment of the present invention. As described above, the magnetoresistive effect element 80 is the three-terminal element. The terminal connected to the first magnetization fixed layer 30 of the three terminals is connected to a ground line 101 (GL) for reading. The two terminals connected to the both ends of the magnetization free layer 10 are connected to first source/drains of two transistors 100a and 100b, respectively. Second source/drains of the two transistors 100a and 100b are connected to bit lines 102a (BLa) and 102b (BLb) for writing, respectively. Gate electrodes of the two transistors 100a and 100b are connected to a word line 103 (WL). In addition, as described later, the magnetic memory cells 90, each shown in FIG. 5, are arranged in the array shape and connected to peripheral circuits to constitute a magnetic random access memory (MRAM).

Next, the writing and reading operations of the magnetic memory cell 90 shown in FIG. 5 will be described. First, when the writing operation is performed, the word line 103 (WL) is made to be "high" to turn the transistors 100a and 100b "ON". In addition, one of the bit lines 102a (BLa) and 102b (BLb) is made to be "high" and the other is made to be "low". The direction in which the writing current flows through the magnetization free layer 10 is varied based on which of the bit lines 102a (BLa) and 102b (BLb) is made to be "high" and made to be "low". Therefore, the data writing to the magnetoresistive effect element 80 can be realized.

When the reading operation is performed, the word line 103 (WL) is made to be "high" to turn the transistors 100a and 100b "ON". In addition, one of the bit lines 102a (BLa) and 102b (BLb) is made to be "high" and the other is made to be "open". In this case, the current passing through the magnetoresistive effect element 80 from one of the bit lines 102a (BLa) and 102b (BLb) flows into the ground line 101 (GL). Therefore, the data reading at high speed due to the magnetoresistive effect can be realized. Here, the circuit shown in FIG. 5 and the settings of the circuit described above are examples for realizing the present exemplary embodiment, and other circuit configurations can be employed.

Figure 6:
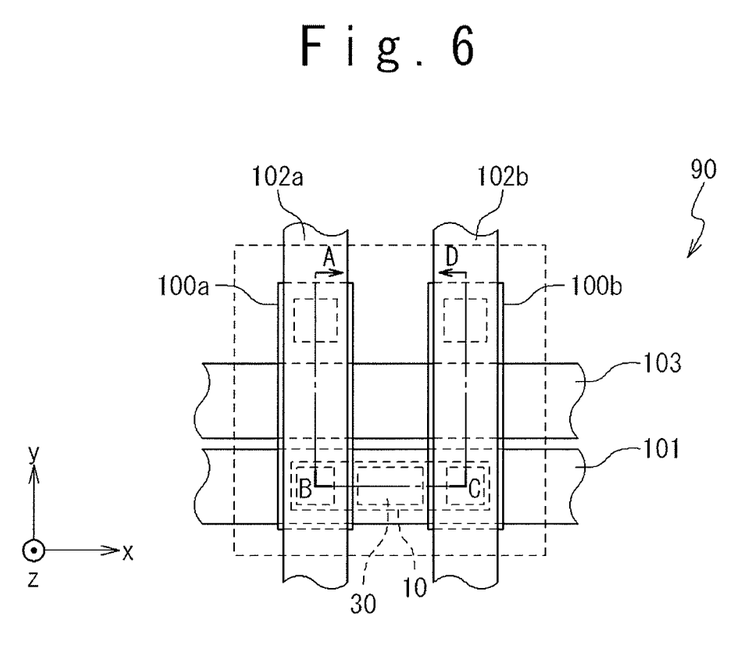
FIG. 6 is a plane view showing an example of a layout of the magnetic memory cell according to the exemplary embodiment of the present invention.
Figure 7:
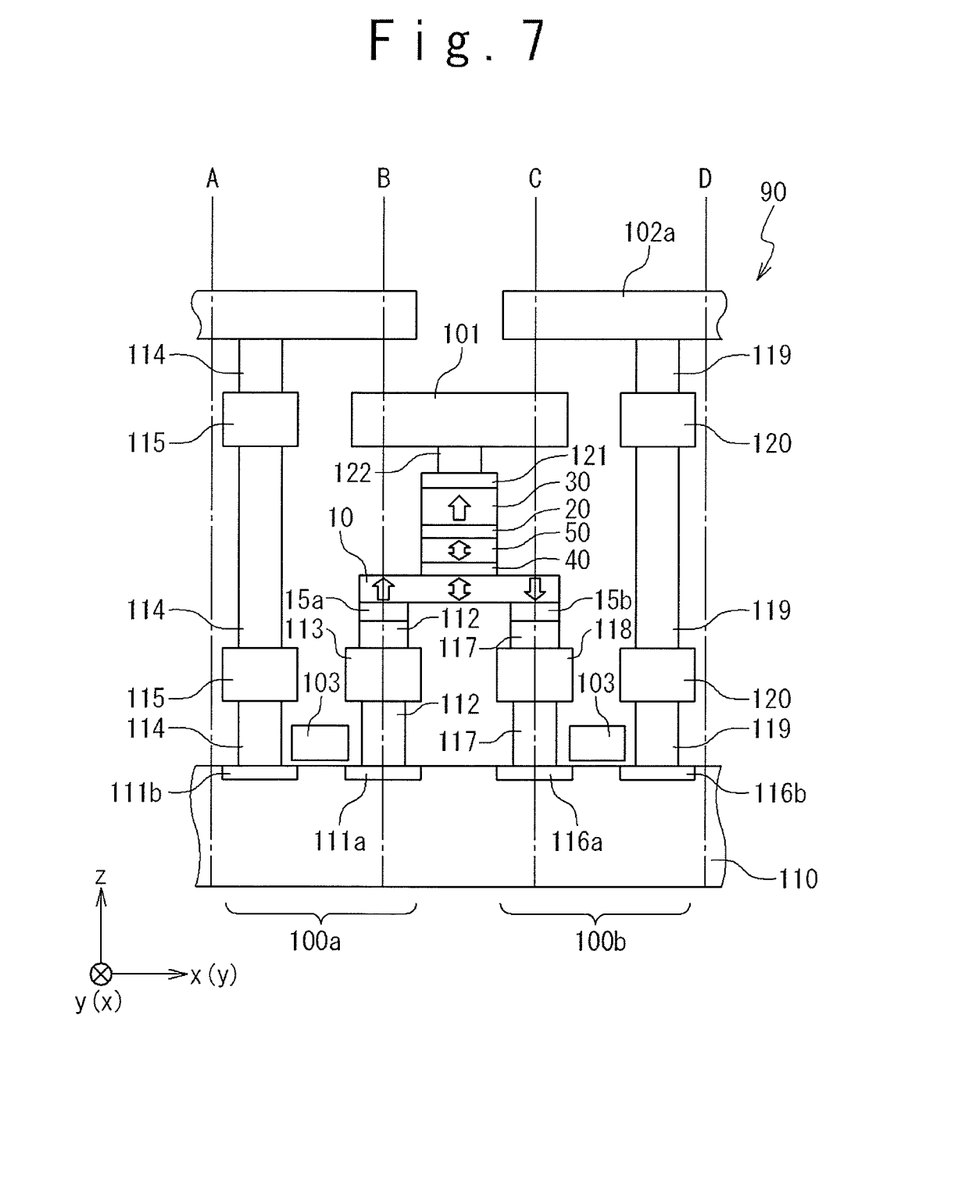
FIG. 7 is a sectional view showing the configuration at the A-B-C-D section of the magnetic memory cell of FIG. 6.

The magnetic memory cell 90 having the configuration shown in FIG. 5 can be realized by using a layout shown below. FIG. 6 is an x-y plane view showing an example of a layout of the magnetic memory cell 90 according to the exemplary embodiment of the present invention. FIG. 7 is a sectional view showing the configuration at the A-B-C-D section of the magnetic memory cell of FIG. 6. As shown in FIG. 7, the NMOS transistors 100a and 100b are formed in a substrate 100. As shown in FIG. 6, the gates of the NMOS transistors 100a and 100b are provided extending in the x axis direction, and used as the word line 103 (WL). In FIG. 7, the first source/drain 111a of the NMOS transistor 100a is connected to the magnetization fixed layer 15a through contacts 112 and a wiring layer 113. The second source/drain 111b is connected to the bit line 102a (BLa) through contacts 114 and wiring layers 115. The first source/drain 116a of the NMOS transistor 100b is connected to the magnetization fixed layer 15b through contacts 117 and a wiring layer 118. The second source/drain 116b is connected to the bit line 102b (BLb) through contacts 119 and wiring layers 120. As shown in FIG. 6, the bit lines 102a and 102b are provided extending in the y axis direction.

With reference to FIG. 7 again, on the magnetization fixed layer 30 of the magnetoresistive effect element 80, an electrode layer 121 is formed. The electrode layer 121 is connected to the ground line 101 (GL) through a contact 122. As shown in FIG. 6, the ground line 101 (GL) is provided extending in the x axis direction. This layout is preferable to reduce the area of the magnetic memory cell 90.

However, the layout shown here is one example and other layouts can be employed to realize the magnetic memory cell 90. For example, even though the NMOS transistors 100a and 100b are provided extending in the y axis direction in FIGS. 6 and 7, the NMOS transistors 100a and 100b may be provided extending to in the x axis direction. In this case, the word line 103 (WL) preferably have protruding portions which can be connected to the gates of the NMOS transistors 100a and 100b, respectively.

(Configuration and Operation of MRAM)

Figure 8:
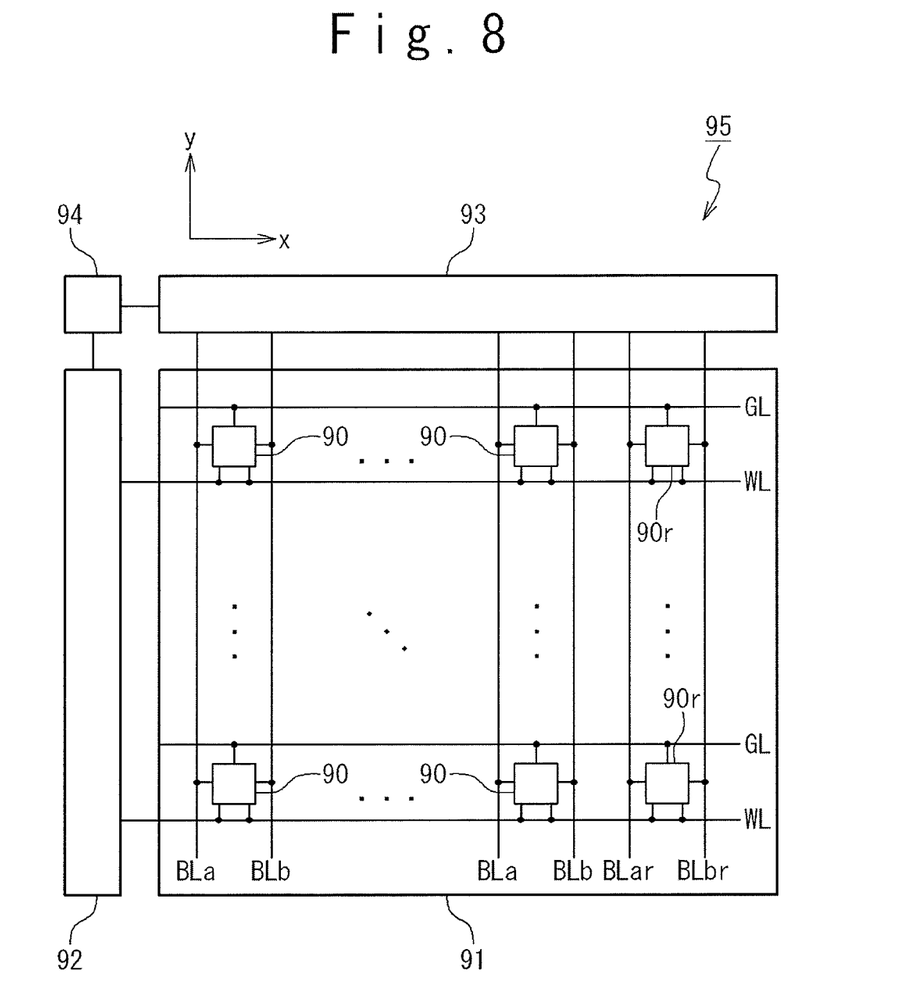
FIG. 8 is a block diagram showing an example of a configuration of a MRAM in which the magnetic memory cells are integrated according to the exemplary embodiment of the present invention.

Next, a configuration and an operation of a MRAM according to the exemplary embodiment of the present invention will be described. FIG. 8 is a block diagram showing an example of the configuration of the MRAM in which the magnetic memory cells are integrated according to the exemplary embodiment of the present invention. As shown in FIG. 8, a MRAM 95 includes a memory array 91 in which a plurality of the magnetic memory cells 90 is arranged in the array shape. The memory array 91 includes the magnetic memory cells 90 which are used for storing data as described in FIG. 5 and reference cells 90r which are referred at the data reading. In the example of FIG. 8, a single column of cells is for the reference cells 90r. The configuration of the reference cell 90r is the same as that of the magnetic memory cell 90. In this case, the MTJ of the reference cell 90r has a resistance value of R0.5 which is the middle of a resistance value of R0 when the data "0" is stored and a resistance value of R1 when the data "1" is stored. However, two columns of cells may be for the reference cells 90r, and one column may be for the reference cells 90r with the resistance value of R0 and the other column may be for the reference cells 90r with the resistance value of R1. In this case, the resistance value of R0.5 is prepared by using the reference cell 90r with the resistance value of R0 and the reference cell 90r with the resistance value of R1 to be used for reading.

The word lines WL (103) and the ground lines GL (101) are provided extending in the X axis direction, respectively. The word lines WL are connected to an X side control circuit 92 at one ends. The X side control circuit 92 selects a word line WL connected to a target magnetic memory cell 90 as a selection word line WL in the data writing operation and the data reading operation. The bit lines BLa (102a) and BLb (102b) are provided extending in the y axis direction, respectively. The bit lines BLa and BLb are connected to a Y side control circuit 93 at one ends. The Y side control circuit 93 selects a bit line BLa and a bit line BLb connected to the target magnetic memory cell 90 as a selection bit line BLa and a selection bit line BLb in the data writing operation and the data reading operation. A control circuit 94 controls the X side control circuit 92 and the Y side control circuit 93 in the data writing operation and the data reading operation.

Next, the writing and reading methods of the MRAM shown in FIG. 8 will be described. First, the writing operation will be described. The X side control circuit 92 selects the selection word line WL. Then, the selection word line WL is pulled up to the "high" level to turn the transistors 100a and 100b "ON". In addition, the Y side control circuit 93 selects the selection bit lines BLa and BLb. Then, one of the selection bit lines BLa and BLb is pulled up to the "high" level and the other is pulled down to the "low" level. Which of the selection bit lines BLa and BLb is pulled up to the "high" level and pulled down to the "low" level is determined based on data to be written in the target magnetic memory cell 90. That is, it is determined based on the direction in which the writing current flows through the magnetization free layer 10. Therefore, the data "0" and the data "1" can be written. The X side control circuit 92, the Y side control circuit 93 and the control circuit 94 controlling them constitute a "writing current supplying circuit" which supplies the writing current to the magnetic memory cell 90.

Next, the reading operation will be described. The X side control circuit 92 selects the selection word line WL. Then, the selection word line WL is pulled up to the "high" level to turn the transistors 100a and 100b "ON". In addition, the Y side control circuit 93 selects the selection bit lines BLa and BLb. Then, one of the selection bit lines BLa and BLb is pulled up to the "high" level and the other is set to the "open". In this case, for example, the reading current flows into the ground line GL from one of the selection bit lines BLa and BLb through the second magnetization fixed layer 15, the magnetization free layer 10, the non-magnetic insertion layer 40, the magnetic insertion layer 50, the spacer layer 20 and the first magnetization fixed layer 30. The potential of the bit line BL in which the reading current flows or the value of the reading current depends on variation of the resistance value of the magnetic tunneling junction (or spin valve) caused by the magnetoresistive effect, the magnetic tunneling junction (or spin valve) including the magnetic insertion layer 50, the spacer layer 20 and the first magnetization fixed layer 30. Therefore, by comparing the output of the selection bit line BL and the output of the reference bit line BLr of the reference cell 90r where the reading current flows similarly, the variation of the resistance value is detected as a voltage signal or a current signal, thereby enabling to read the data at high speed. The X side control circuit 92, the Y side control circuit 93 and the control circuit 94 controlling them constitute a "reading current supplying and sensing circuit" which supplies the reading current to the magnetic memory cell 90 and senses the data.

As described above, the magnetoresistive effect element of the present exemplary embodiment can be provided with the magnetization free layer constituting the domain wall motion portion for writing and the magnetic insertion layer (so-called the free layer) constituting the magnetic tunneling junction (MTJ) for reading, separately. Therefore, the optimization of the magnetic properties as the domain wall motion portion for writing and the optimization of the magnetic properties as the magnetic insertion layer for reading can be carried out independently from each other. As a result, by carrying out the optimizations, the writing current can be reduced and the reading magnetoresistive effect can be sufficiently increased. That is, the magnetoresistive effect element and the MRAM can be provided, in which the writing current is sufficiently reduced and the reading magnetoresistive effect is sufficiently increased.

While the invention has been particularly shown and described with reference to the exemplary embodiments thereof, the invention is not limited to these exemplary embodiments. It will be understood by those of ordinary skill in the art that various changes in form and details may be made therein without departing from the spirit and scope of the present invention as defined by the claims.

This application is based upon and claims the benefit of priority from Japanese patent application No. 2009-033368 filed on Feb. 17, 2009, the disclosure of which is incorporated herein in its entirety by reference.

The invention claimed is:

1. A magnetoresistive effect element comprising:
a magnetization free layer;
a non-magnetic insertion layer configured to be provided adjacent to said magnetization free layer;
a magnetic insertion layer configured to be provided adjacent to said non-magnetic insertion layer and opposite to said magnetization free layer with respect to said non-magnetic insertion layer;
a spacer layer configured to be provided adjacent to said magnetic insertion layer and opposite to said non-magnetic insertion layer with respect to said magnetic insertion layer; and
a first magnetization fixed layer configured to be provided adjacent to said spacer layer and opposite to said magnetic insertion layer with respect to said spacer layer,
wherein said magnetization free layer and said first magnetization fixed layer have magnetization components in directions approximately perpendicular to a film surface,
wherein said magnetization free layer includes:
two magnetization fixed portions, and
a domain wall motion portion arranged between said two magnetization fixed portions,
wherein magnetization of one of said two magnetization fixed portions and magnetization of the other of said two magnetization fixed portions are fixed approximately anti-parallel to each other in a direction approximately perpendicular to a film surface, and
wherein said domain wall motion portion has a magnetic anisotropy in a direction perpendicular to a film surface.

2. The magnetoresistive effect element according to claim 1, wherein said magnetization free layer and said magnetic insertion layer are magnetically coupled in anti-parallel direction with each other.

3. The magnetoresistive effect element according to claim 1, wherein said magnetization free layer and said magnetic insertion layer are magnetically coupled in parallel direction with each other.

4. The magnetoresistive effect element according to claim 1, wherein said magnetic insertion layer has a magnetization in a direction approximately perpendicular to a film surface.

5. The magnetoresistive effect element according to claim 1, wherein said magnetic insertion layer includes a lamination film including at least two magnetic layer magnetically coupled in anti-parallel direction with each other.

6. The magnetoresistive effect element according to claim 1, wherein said magnetic insertion layer includes Co, Fe and B as main components.

7. The magnetoresistive effect element according to claim 1, wherein said non-magnetic insertion layer includes Ru as a main component.

8. The magnetoresistive effect element according to claim 1, wherein when a data writing operation is carried out, a writing current passes through one of said two magnetization fixed portions, said domain wall motion portion and the other of said two magnetization fixed portions, and
Wherein when a data reading operation is carried out, a reading current passes through said magnetization free layer, said non-magnetic insertion layer, said magnetic insertion layer, said spacer layer and said first magnetization fixed layer.

9. The magnetoresistive effect element according to claim 1, further comprising:
two second magnetization fixed layers configured to be provided adjacent to said two magnetization fixed portions, respectively,
wherein said two second magnetization fixed layers have magnetization components in directions approximately perpendicular to a film surface.

10. A magnetic random access memory comprising:
a plurality of memory cells configured to be arranged in a array shape, each having a magnetoresistive effect element,
wherein said magnetoresistive effect element includes:
a magnetization free layer;
a non-magnetic insertion layer configured to be provided adjacent to said magnetization free layer;
a magnetic insertion layer configured to be provided adjacent to said non-magnetic insertion layer and opposite to said magnetization free layer with respect to said non-magnetic insertion layer;
a spacer layer configured to be provided adjacent to said magnetic insertion layer and opposite to said non-magnetic insertion layer with respect to said magnetic insertion layer; and
a first magnetization fixed layer configured to be provided adjacent to said spacer layer and opposite to said magnetic insertion layer with respect to said spacer layer,
wherein said magnetization free layer and said first magnetization fixed layer have magnetization components in directions approximately perpendicular to a film surface,
wherein said magnetization free layer includes:
two magnetization fixed portions, and
a domain wall motion portion arranged between said two magnetization fixed portions,
wherein magnetization of one of said two magnetization fixed portions and magnetization of the other of said two magnetization fixed portions are fixed approximately anti-parallel to each other in a direction approximately perpendicular to a film surface, and
wherein said domain wall motion portion has a magnetic anisotropy in a direction perpendicular to a film surface.

11. The magnetic random access memory according to claim 10, wherein said magnetization free layer and said magnetic insertion layer are magnetically coupled in anti-parallel direction with each other.

12. The magnetic random access memory according to claim 10, wherein said magnetization free layer and said magnetic insertion layer are magnetically coupled in parallel direction with each other.

13. The magnetic random access memory according to claim 10, wherein said magnetic insertion layer has a magnetization in a direction approximately perpendicular to a film surface.

14. The magnetic random access memory according to claim 10, wherein said magnetic insertion layer includes a lamination film including at least two magnetic layer magnetically coupled in anti-parallel direction with each other.

15. The magnetic random access memory according to claim 10, wherein said magnetic insertion layer includes Co, Fe and B as main components.

16. The magnetic random access memory according to claim 10, wherein said non-magnetic insertion layer includes Ru as a main component.

17. The magnetic random access memory according to claim 10, wherein when a data writing operation is carried out, a writing current passes through one of said two magnetization fixed portions, said domain wall motion portion and the other of said two magnetization fixed portions, and wherein when a data reading operation is carried out, a reading current passes through said magnetization free layer, said non-magnetic insertion layer, said magnetic insertion layer, said spacer layer and said first magnetization fixed layer.

18. The magnetic random access memory according to claim 10, wherein said magnetoresistive effect element further includes:

two second magnetization fixed layers configured to be provided adjacent to said two magnetization fixed portions, respectively, wherein said two second magnetization fixed layers have magnetization components in directions approximately perpendicular to a film surface.

* * * * *